US012776773B2

(12) United States Patent
Ye et al.

(10) Patent No.: US 12,776,773 B2
(45) Date of Patent: Oct. 27, 2026

(54) RADIO-FREQUENCY SWITCH CONTROL LINK AND SYSTEM AND CONTROL METHOD THEREFOR

(71) Applicant: MAXSCEND MICROELECTRONICS COMPANY LIMITED, Wuxi (CN)

(72) Inventors: Peng Ye, Wuxi (CN); Zheng Zhou, Wuxi (CN)

(73) Assignee: MAXSCEND MICROELECTRONICS COMPANY LIMITED, Wuxi (CN)

( * ) Notice: Subject to any disclaimer, the term of this patent is extended or adjusted under 35 U.S.C. 154(b) by 23 days.

(21) Appl. No.: 19/064,380

(22) Filed: Feb. 26, 2025

(65) Prior Publication Data

US 2025/0219637 A1 Jul. 3, 2025

Related U.S. Application Data

(63) Continuation of application No. PCT/CN2023/112832, filed on Aug. 14, 2023.

(30) Foreign Application Priority Data

Sep. 1, 2022 (CN) ......................... 202211067344.5

(51) Int. Cl.
*H02M 3/07* (2006.01)
*H02M 1/00* (2006.01)
*H03K 17/687* (2006.01)

(52) U.S. Cl.
CPC ........ *H03K 17/687* (2013.01); *H02M 1/0045* (2021.05); *H02M 3/07* (2013.01)

(58) Field of Classification Search
CPC .... H03K 17/687; H02M 1/0045; H02M 3/07; H04B 1/401; H04B 1/44
See application file for complete search history.

(56) References Cited

U.S. PATENT DOCUMENTS

| | | | | |
|---|---|---|---|---|
| 2012/0252377 A1* | 10/2012 | Wachi | H03K 17/002 | 455/83 |
| 2016/0036320 A1* | 2/2016 | Crandall | H02M 3/07 | 455/77 |
| 2016/0172969 A1* | 6/2016 | Chen | H02M 7/103 | 327/536 |
| 2022/0094264 A1* | 3/2022 | Kurachi | H03K 3/02 | |

* cited by examiner

*Primary Examiner* — Patrick O Neill
(74) *Attorney, Agent, or Firm* — Westbridge IP LLC

(57) ABSTRACT

A radio-frequency switch control link includes: an edge detection module, configured to output a boost-mode signal in response to a boost control signal and output a normal-mode signal in response to a normal control signal; and a bias voltage generation module, which includes a first oscillator and a charge pump. The first oscillator is configured to output a first frequency in response to the boost-mode signal and output a second frequency in response to the normal-mode signal, wherein the first frequency is greater than the second frequency. A pump capacitor unit in the charge pump is configured to have a first capacitance value in response to the boost-mode signal, and have a second capacitance value in response to the normal-mode signal, wherein the first capacitance value is greater than the second capacitance value.

17 Claims, 11 Drawing Sheets

RADIO-FREQUENCY SWITCH CONTROL LINK AND SYSTEM AND CONTROL METHOD THEREFOR

CROSS-REFERENCE TO RELATED APPLICATIONS

This application is a continuation of International Application No. PCT/CN2023/112832, filed on Aug. 14, 2023, which claims priority to Chinese Patent Application No. 202211067344.5, filed on Sep. 1, 2022. The disclosures of the aforementioned applications are hereby incorporated by reference in their entireties.

TECHNICAL FIELD

The present application relates to the technical field of radio-frequency integrated circuits, and in particular to a radio-frequency switch control link and system and a control method therefor.

BACKGROUND

In a radio-frequency communication system, a radio-frequency switching device is provided between an antenna and a front-end circuit module of a transceiver to implement functions such as switching between receiving and transmitting channels, and switching between different frequency bands.

In the radio-frequency communication system, the radio-frequency switch control link is required to generate a bias voltage to control the conduction state of a radio-frequency switch. However, existing radio-frequency switch control links have poor performance and are slow to generate bias voltages.

SUMMARY

The present application provides a radio-frequency switch control link and system and a control method therefor to solve the problems that the radio-frequency switch control links have poor performance and are slow to generate bias voltages.

According to one aspect of the present application, a radio-frequency switch control link is provided. The radio-frequency switch control link comprises:

an input port, configured to input an original signal;

an edge detection module, wherein an input end of the edge detection module is connected to the input port, and a control end of the edge detection module is connected to a control signal, and the edge detection module is configured to output a boost-mode signal when the control end is connected to a boost control signal and output a normal-mode signal when the control end is connected to a normal control signal; and a bias voltage generation module, which comprises a first oscillator and at least one stage of a charge pump, wherein the charge pump and the first oscillator are both connected to an output end of the edge detection module; the first oscillator is configured to output a first frequency in response to the boost-mode signal, and output a second frequency in response to the normal-mode signal, wherein the first frequency is greater than the second frequency; the charge pump comprises a pump capacitor unit, and the pump capacitor unit is configured to have a first capacitance value in response to the boost-mode signal, and have a second capacitance value in response to the normal-mode signal, wherein the first capacitance value is greater than the second capacitance value.

Optionally, the bias voltage generation module further comprises a low dropout linear regulator configured to supply power to the charge pump and the first oscillator; and the low dropout linear regulator is connected to the output end of the edge detection module, and the low dropout linear regulator is configured to output a first voltage in response to the boost-mode signal and output a second voltage in response to the normal-mode signal, wherein the first voltage is greater than the second voltage.

Optionally, the edge detection module comprises: a first two-way selector, a second two-way selector, a first inverter, a first D flip-flop, a second D flip-flop, an OR gate and a second oscillator;

a first input end of the first two-way selector and an input end of the first inverter are connected to each other to serve as the input end of the edge detection module; a second input end of the first two-way selector is connected to a logic high level; a control end of the first two-way selector and a control end of the second two-way selector are connected to each other to serve as the control end of the edge detection module; an output end of the first two-way selector is connected to a clock end of the first D flip-flop;

a first input end of the second two-way selector is connected to an output end of the first inverter, a second input end of the second two-way selector is connected to a logic high level, and an output end of the two-way selector is connected to a clock end of the second D flip-flop;

a D end of the first D flip-flop and a D end of the second D flip-flop are both connected to an output end of the second oscillator; a Q end of the first D flip-flop and a Q end of the second D flip-flop are connected to two input ends of the OR gate respectively; and an output end of the OR gate serves as the output end of the edge detection module.

Optionally, the pump capacitor unit comprises a main capacitor and at least one branch connected in parallel with the main capacitor, and each branch comprises a capacitor switch and a branch capacitor connected in series; the capacitor switch is configured to be turned on in response to the boost-mode signal and turned off in response to the normal-mode signal.

Optionally, the first oscillator is configured to adjust an output frequency according to an operating voltage; a voltage end of the first oscillator is connected to a first voltage source and a second voltage source; wherein the second voltage source is connected in series with a voltage switch, a branch formed by the second voltage source connected in series with the voltage switch is connected in parallel with the first voltage source, and the voltage switch is configured to be turned on in response to the boost-mode signal and turned off in response to the normal-mode signal.

Optionally, the first oscillator is configured to adjust an output frequency according to an operating current; a current end of the first oscillator is connected to a first current source and a second current source; wherein the second current source is connected in series with a current switch, a branch formed by the second current source connected in series with the current switch is connected in parallel with the first current source, and the current switch is configured to be turned on in response to the boost-mode signal and turned off in response to the normal-mode signal.

Optionally, the first oscillator is a ring oscillator; the ring oscillator comprises a delay capacitor module, and the delay capacitor module comprises a main delay capacitor and at least one delay capacitor branch which are connected in parallel; each delay capacitor branch comprises a secondary delay capacitor and a delay capacitor switch which are connected in series, and the delay capacitor switch is configured to be turned on in response to the boost-mode signal and turned off in response to the normal-mode signal.

Optionally, the radio-frequency switch control link further comprises a level shift module, and the level shift module is connected to an output end of the bias voltage generation module.

According to another aspect of the present application, a radio-frequency switch control system is provided, comprising the radio-frequency switch control link and a radio-frequency switch.

According to another aspect of the present application, a control method for a radio-frequency switch control link is provided, which is used to control the radio-frequency switch control link, and the control method for the radio-frequency switch control link comprises:

under a first preset condition, transmitting a boost-mode control signal to the control end of the edge detection module, to control the edge detection module to output the boost-mode signal; and under a second preset condition, transmitting a normal-mode control signal to the control end of the edge detection module, to control the edge detection module to output the normal-mode signal.

According to the technical solution of the embodiment of the present application, in the radio-frequency switch control link, the bias voltage generation module has two modes: boost mode and normal mode. In the boost mode, the first oscillator outputs a high-frequency signal, and the pump capacitor is a high-capacity capacitor, which can quickly generate the required bias voltage and also has a high driving capability; and in the normal mode, the first oscillator outputs a low-frequency signal, and the pump capacitor is a low-capacity capacitor, which can reduce spurs to ensure stable operation in the normal mode.

It should be understood that what is described in this section is neither intended to identify key or important features of the embodiments of the present application, nor intended to limit the scope of the present application. Other features of the present application will become easily understood from the following description.

BRIEF DESCRIPTION OF THE DRAWINGS

In order to describe the technical solutions in the embodiments of the present application more clearly, the drawings required for describing the embodiments will be introduced briefly. Obviously, the drawings in the description below are just some of the embodiments of the present application. For those of ordinary skill in the art, other drawings can be obtained based on these drawings without creative work. In the drawings.

DETAILED DESCRIPTION OF THE EMBODIMENTS

In order to allow those skilled in the art to better understand the solution of the present application, the technical solution in the embodiments of the present application will be described clearly and completely hereinafter in combination with the drawings of these embodiments of the present application. Apparently, the embodiments described are only some embodiments of the present application, rather than all embodiments. All other embodiments obtained by those of ordinary skill in the art without creative work based on the embodiments of the present application shall be within the scope of protection of the present application.

It should be noted that the terminologies in the description and claims of the present application as well as the drawings herein, including “first”, “second” and the like, are used to distinguish among similar objects, rather than describing a specific sequence or an order of precedence. It should be understood that the data used in such a way can be exchanged where appropriate, so that the embodiments of the present application described herein can be implemented in addition to those illustrated or described herein. In addition, the intent of terminologies of “comprise” and “have” and any variant forms thereof is to cover a non-exclusive inclusion; for example, the processes, methods, systems, products or equipment containing a series of steps or units are not to list all of these steps or units clearly, or rather contain other steps or units inherent to these processes, methods, products or equipment not clearly listed.

Figure 1:
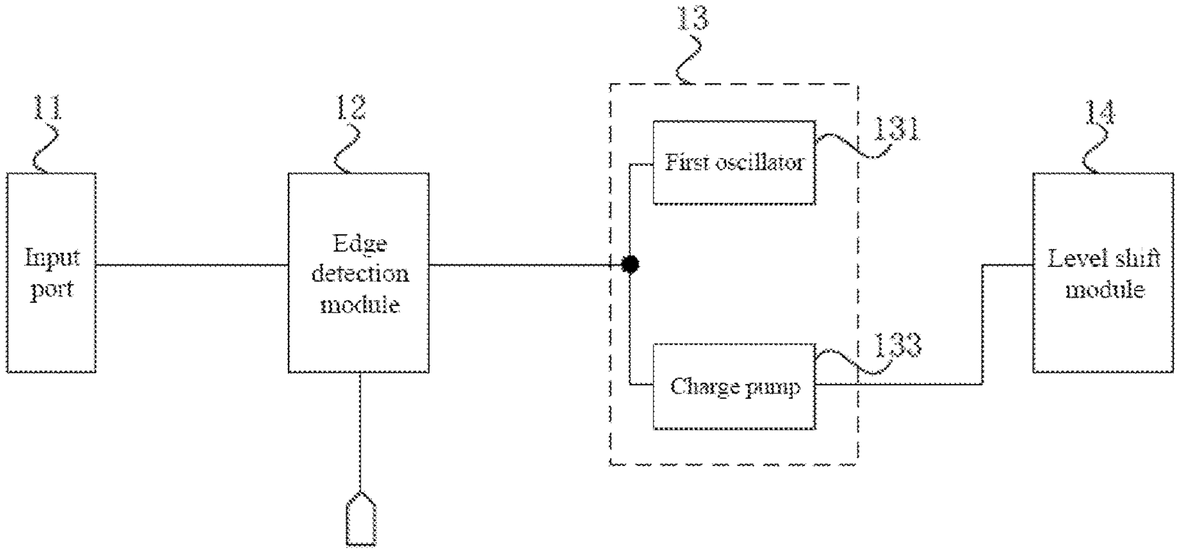
FIG. 1 is a schematic diagram of a circuit structure of a radio-frequency switch control link provided by an embodiment of the present application.

FIG. 1 is a schematic diagram of a circuit structure of a radio-frequency switch control link provided in an embodiment of the present application. Referring to FIG. 1, the radio-frequency switch control link comprises: an input port

11, configured to input an original signal; an edge detection module 12, wherein an input end of the edge detection module 12 is connected to the input port 11, and a control end of the edge detection module 12 is connected to a control signal, and the edge detection module 12 is configured to output a boost-mode signal when the control end thereof is connected to a boost control signal and output a normal-mode signal when the control end thereof is connected to a normal control signal; and a bias voltage generation module 13, which comprises a first oscillator 131 and at least one stage of a charge pump 133, wherein the charge pump 133 and the first oscillator 131 are both connected to an output end of the edge detection module 12. The first oscillator 131 is configured to output a first frequency in response to the boost-mode signal and output a second frequency in response to the normal-mode signal, wherein the first frequency is greater than the second frequency. The charge pump comprises a pump capacitor unit, and the pump capacitor unit is configured to have a first capacitance value in response to the boost-mode signal and have a second capacitance value in response to the normal-mode signal, wherein the first capacitance value is greater than the second capacitance value.

Specifically, the radio-frequency switch control link is used to output a bias voltage to control the radio-frequency switch to turn on or off. The input port 11 is configured to input an original signal. The input port 11 may be, for example, a digital I/O including GPIO, such as MIPI, IIC or SPI. The edge detection module 12 can generate a boost-mode signal or a normal-mode signal as needed. For example, when the radio-frequency switch is required to generate a negative voltage or a positive voltage (that is, a stage in which the bias voltage generation module changes from an original state to a state of forming the negative voltage, or from the original state to a state of forming the positive voltage) or when it is required to switch between the positive voltage and the negative voltage, the edge detection module 12 is controlled to generate a boost-mode signal so that the bias voltage generation module enters a boost mode. When the bias voltage generation circuit can generate a stable negative or positive voltage bias, the edge detection module 12 is controlled to generate a normal-mode signal, so that the bias voltage generation module 13 enters a normal mode.

The structural principle of the bias voltage generation module 13 is well known in the art, and may specifically include an oscillator and a charge pump. More specifically, the charge pump contains a pump capacitor unit, and through the charging and discharging of the pump capacitor unit, the voltage at the input end is reduced or increased at a certain ratio to obtain the required output voltage. In addition, the first oscillator 131 outputs a high-frequency signal in the boost mode, and the first oscillator 131 outputs a low-frequency signal in the normal mode. The charge pump follows a formula: $I=F\ (V/I)\ VC=V^{\beta}C$. From this formula, it can be concluded that when the frequency and capacitance value are large, the voltage can be generated fast, that is, increasing the frequency and capacitance value of the pump capacitor can greatly speed up the generation of negative voltage bias. On such a basis, in the present embodiment, the first oscillator 131 is configured to generate a signal of the first frequency according to the boost-mode signal, wherein the boost-mode signal may be, for example, a high level. The first oscillator 131 generates a signal of the second frequency according to the normal-mode signal, wherein the normal-mode signal may be, for example, a low level. Meanwhile, the effective capacitance value of the configured pump capacitor unit is also adjusted to a first capacitance value according to the boost-mode signal, and adjusted to a second capacitance value according to the normal-mode signal. When the bias voltage generation module 13 receives the boost-mode signal and enters the boost mode, the first oscillator outputs a high-frequency signal, and the pump capacitor unit is a high-capacity capacitor, thereby quickly generating a negative or positive voltage bias; when the bias voltage generation module 13 enters the normal mode after receiving the normal-mode signal, the first oscillator outputs a low-frequency signal, and the pump capacitor unit is a low-capacity capacitor, which can reduce spurs to ensure stable operation in the normal mode. In addition, the internal resistance of the charge pump $R=1/FC$. When the pump capacitance is large and the frequency is high, the internal resistance of the charge pump is also very small. At this time, the charge pump is equivalent to a high-capacity capacitor, thus making the charge pump have a high driving ability.

According to the technical solution of the present embodiment, in the radio-frequency switch control link, the bias voltage generation module has two modes: the boost mode and the normal mode. In the boost mode, the first oscillator outputs a high-frequency signal, and the pump capacitor is a high-capacity capacitor, which can quickly generate the required bias voltage and also has a high driving capability; and in the normal mode, the first oscillator outputs a low-frequency signal, and the pump capacitor is a low-capacity capacitor, which can reduce spurs to ensure stable operation in the normal mode.

Preferably, the radio-frequency switch control link in the present embodiment can be in the form of an integrated circuit. More preferably, various components on the integrated circuit can be manufactured based on Silicon-On-Insulator (SOI, silicon technology). The SOI process can realize dielectric isolation of various components in the integrated circuit and completely eliminate the parasitic latch-up effect in a CMOS circuit. At the same time, the integrated circuit made by the SOI process also have such advantages as small integrated capacitance, high integration density, high speed, simple process, small short channel effect, and especial applicability for low-voltage and low-power circuits.

Preferably, in FIG. 1, the radio-frequency switch control link also comprises a level shift module 14. The level shift module 14 is connected to the output end of the bias voltage generation module 13 and is used to shift the level output by the bias voltage generation module 13. Therefore, the level with only one polarity is shifted to a level with two polarities, thus facilitating the use by a subsequent radio-frequency switch. The specific circuit structure of the level shift module 14 is well known to those skilled in the art and will not be described again here.

Figure 2:
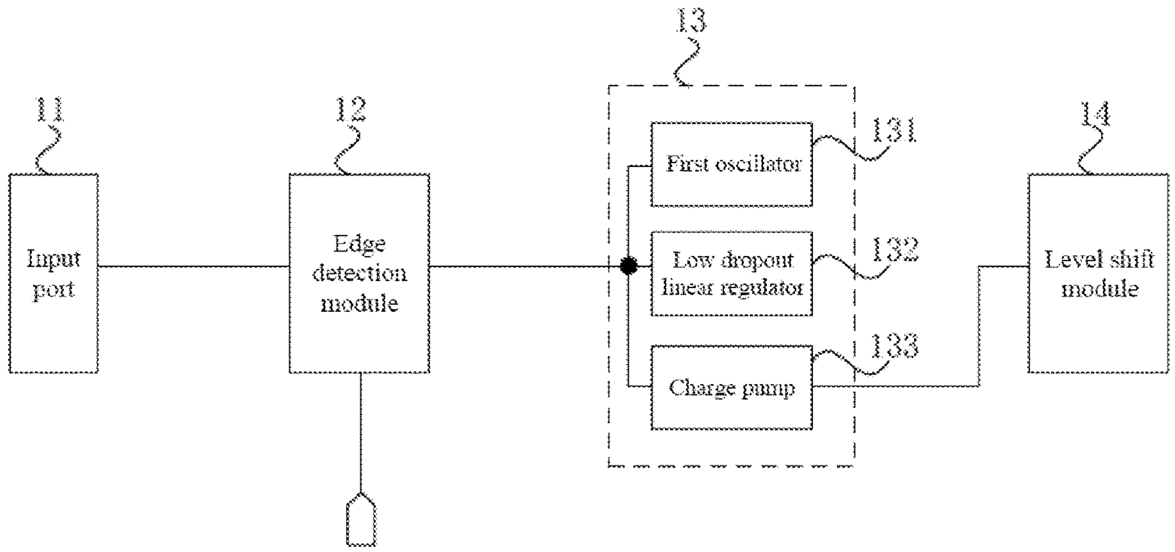
FIG. 2 is a schematic diagram of a circuit structure of another radio-frequency switch control link provided by an embodiment of the present application.
Figure 3:
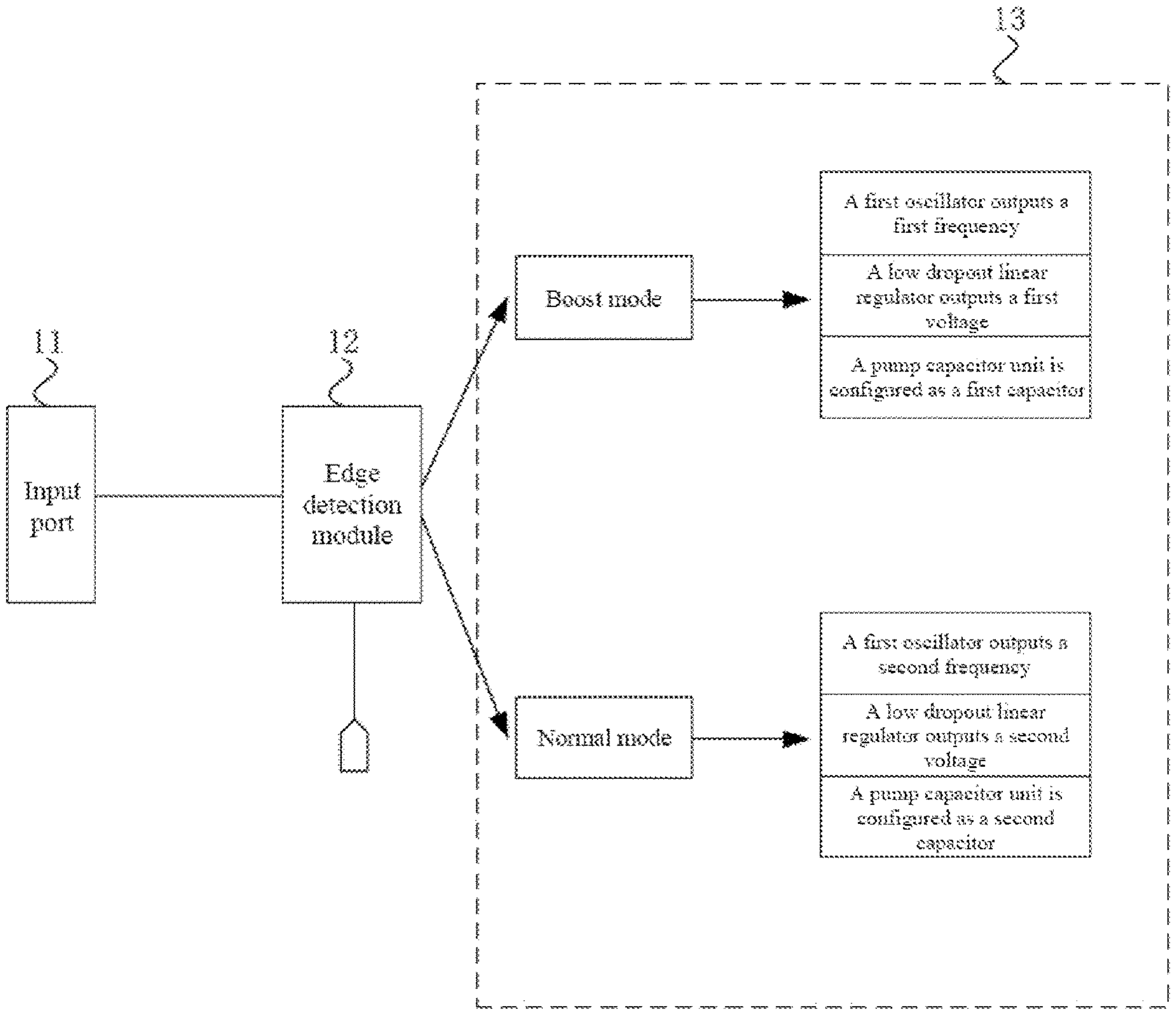
FIG. 3 is a schematic diagram of a working state of a radio-frequency switch control link provided by an embodiment of the present application.

Optionally, FIG. 2 is a schematic diagram of a circuit structure of another radio-frequency switch control link provided by an embodiment of the present application. FIG. 3 is a schematic diagram of a working state of a radio-frequency switch control link provided by an embodiment of the present application. Referring to FIG. 2 and FIG. 3, the bias voltage generation module 13 further comprises a low dropout linear regulator 132. The low dropout linear regulator 132 is used to supply power to the charge pump 133 and the first oscillator 131. The low dropout linear regulator 132 is connected to the output end of the edge detection module 12. The low dropout linear regulator 132 is configured to output a first voltage in response to the boost-mode signal and output a second voltage in response to the normal-mode signal, wherein the first voltage is greater than the second voltage.

Specifically, the specific circuit structure of the low dropout linear regulator 132 is well known to those skilled in the art and will not be described again here. The low dropout linear regulator 132 is used to step down and stabilize an external voltage and input the processed voltage into the first oscillator and the charge pump, thereby ensuring the stable operation of the first oscillator and the charge pump. In the normal mode, the low dropout linear regulator 132 outputs the second voltage. Since the voltage is small at this time, the power consumption of the low dropout linear regulator 132 can be greatly reduced. At the same time, in the boost mode, the low dropout linear regulator 132 outputs the first voltage, and the first voltage is large, so the bias voltage is generated faster.

Figure 4:
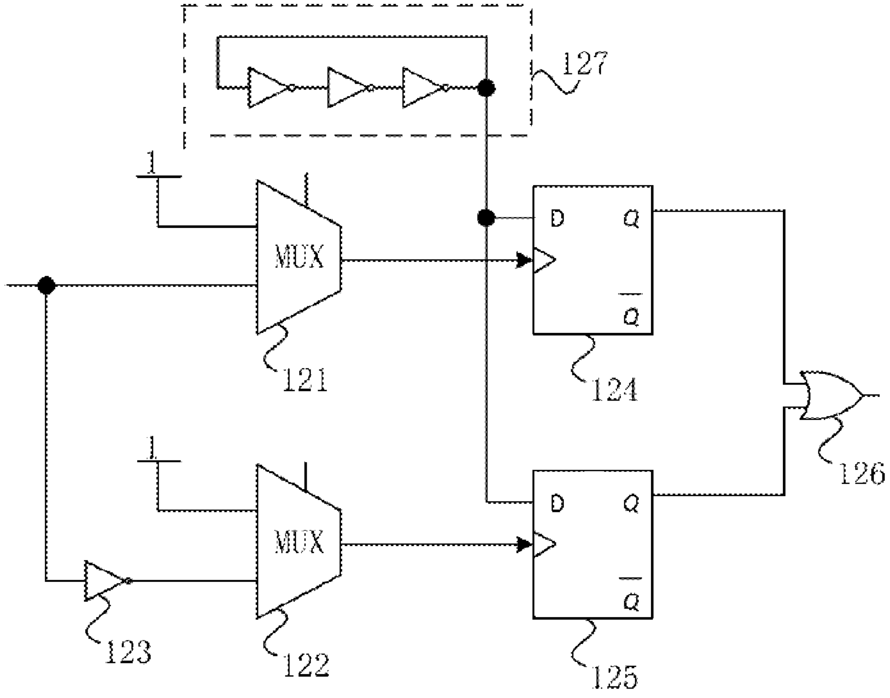
FIG. 4 is a schematic diagram of a circuit structure of an edge detection module provided by an embodiment of the present application.

Optionally, FIG. 4 is a schematic diagram of a circuit structure of an edge detection module provided by an embodiment of the present application. The edge detection module comprises a first two-way selector 121, a second two-way selector 122, a first inverter 123, a first D flip-flop 124, a second D flip-flop 125, an OR gate 126 and a second oscillator 127; a first input end of the first two-way selector 121 and an input end of the first inverter 123 are connected to each other to serve as an input end of the edge detection module; a second input end of the first two-way selector 121 is connected to a logic high level; a control end of the first two-way selector 121 and a control end of the second two-way selector 122 are connected to each other to serve as a control end of the edge detection module; an output end of the first two-way selector 121 is connected to a clock end of the first D flip-flop 124; a first input end of the second two-way selector 122 is connected to an output end of the first inverter 123, a second input end of the second two-way selector 122 is connected to a logic high level, and an output end of the second two-way selector 122 is connected to a clock end of the second D flip-flop 125; a D end of the first D flip-flop 124 and a D end of the second D flip-flop 125 are both connected to an output end of the second oscillator 127; a Q end of the first D flip-flop 124 and a Q end of the second D flip-flop 125 are respectively connected to two input ends of the OR gate 126; and an output end of the OR gate 126 serves as the output end of the edge detection module.

Specifically, the present embodiment provides a specific circuit structure of the edge detection module, wherein a signal at the control end of the edge detection module may be a pulse signal, that is, the boost-mode signal is a high level and the normal-mode signal is a low level. Under the control of the boost-mode signal, both the first two-way selector 121 and the second two-way selector 122 both have the first input end connected to the output end, so that the clock end of the corresponding D flip-flop is connected to the clock signal, to control the generation of the boost-mode signal. At the same time, the D end of the D flip-flop is connected to a clock signal generated by the second oscillator 127, and the clock signal can control the duration of the boost-mode signal. Preferably, each communication system can control the duration of the boost-mode signal by configuring the frequency of the clock signal output by the second oscillator 127. Depending on the duration of the boost mode, the boost-mode signal can be classified into a narrow boost-mode signal or a wide boost-mode signal. Under the control of the wide boost-mode signal, the pump capacitor in the charge pump may be directly charged and discharged; while for the narrow boost-mode signal, a gate of a switching transistor in the charge pump may be charged and discharged after being connected to a zero potential for a transition. According to the capacitance formula C=Q/U, by the transition of being connected to the zero potential, only a small decoupling capacitor (one end of the decoupling capacitor is connected to a connection line between the charge pump 133 and the level shift module 14, and the other end is connected to the ground, referring to the decoupling capacitor 30 in FIG. 10) needs to be provided for the narrow boost-mode signal, thereby saving costs.

Figure 5:
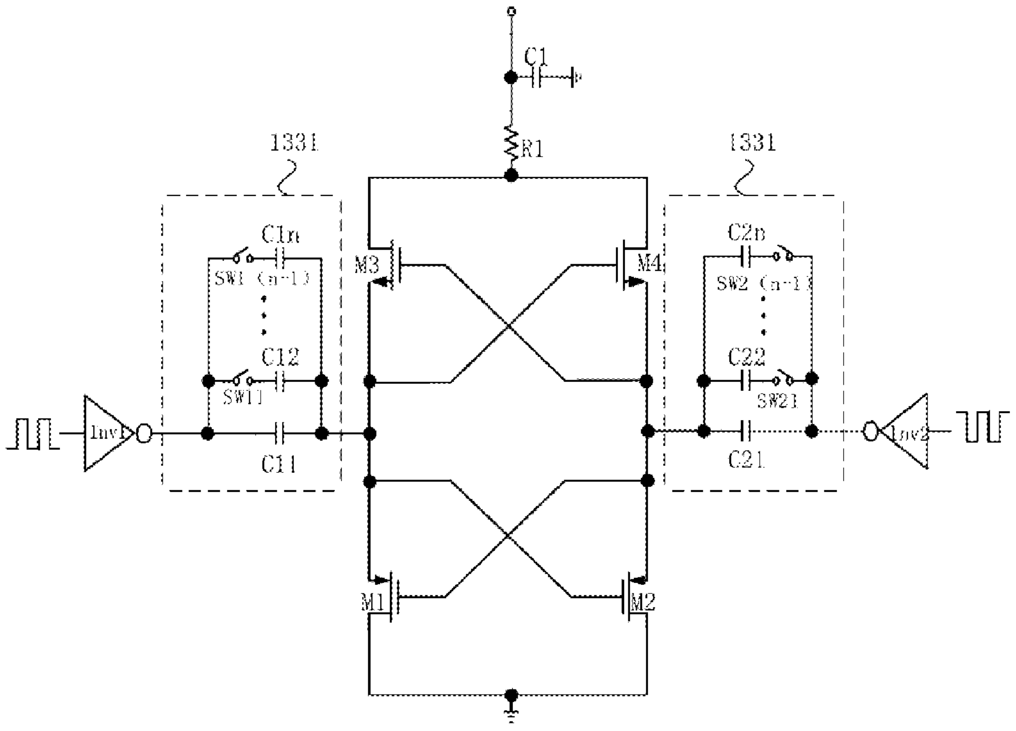
FIG. 5 is a schematic diagram of a circuit structure of a charge pump provided by an embodiment of the present application.

Optionally, FIG. 5 is a schematic diagram of a circuit structure of a charge pump provided by an embodiment of the present application. Referring to FIG. 5, the charge pump comprises an inverter Inv1, an inverter Inv2, a load capacitor C1, a load resistor R1, a transistor M1, a transistor M2, a transistor M3 and a transistor M4, which have the connection relationships and working principles the same as those of a traditional charge pump, and will not be described again here. Different from the traditional charge pumps, the pump capacitor unit 1331 according to the present embodiment comprises a main capacitor and at least one branch connected in parallel with the main capacitor. Each branch is connected in series with a capacitor switch and a branch capacitor. The capacitor switch is turned on in response to the boost-mode signal and turned off in response to the normal-mode signal.

In the present embodiment, in the pump capacitor unit 1331 connected to the inverter Inv1, the main capacitor is capacitor C11, and the branch capacitors are capacitor C12 to capacitor CIn which respectively correspond to capacitor switch SW11 to capacitor switch SW1($n$−1); and in the pump capacitor unit 1331 connected to the inverter Inv2, the main capacitor is capacitor C21, and the branch capacitors are capacitor C22 to capacitor C2$n$ which respectively correspond to capacitor switch SW21 to capacitor switch SW2($n$−1). Under the control of the boost-mode signal, each capacitor switch is turned on, causing the main capacitor and the branch capacitor to be connected in parallel, which is equivalent to increasing the effective capacitance value of the pump capacitor. Under the control of the normal-mode signal, each capacitor switch is turned off, making the effective capacitance value of the pump capacitor be only the capacitance value of the main capacitor, which is small at this time. Of course, other methods can also be used to control the capacitance value of the pump capacitor, for example, the pump capacitor may be implemented as a variable capacitor.

Figure 6:
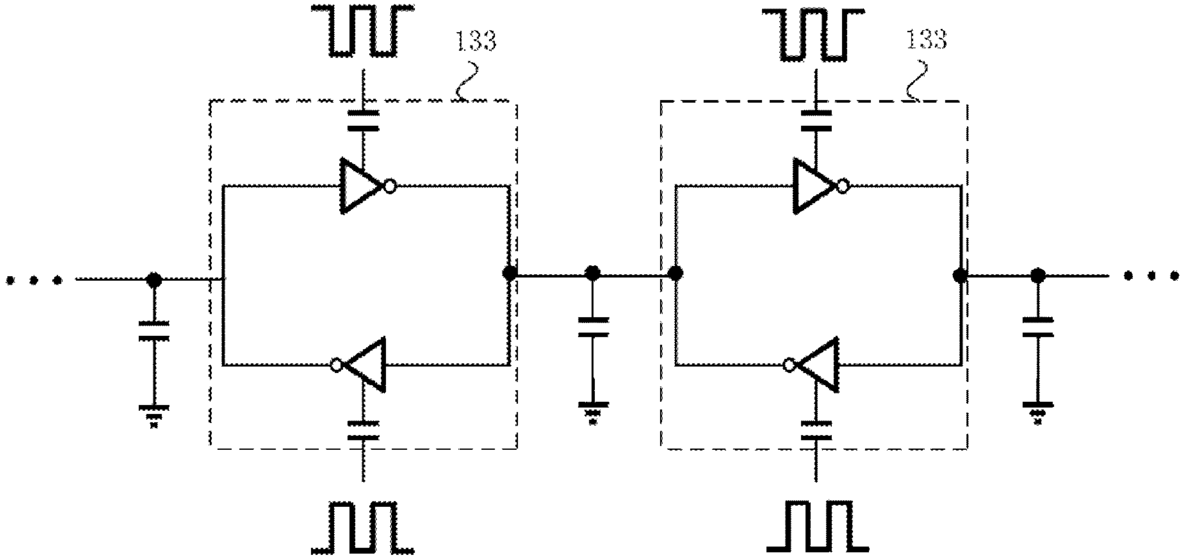
FIG. 6 is a schematic diagram of a circuit structure in which multiple stages of charge pumps are connected in cascade provided by an embodiment of the present application.

Preferably, the bias voltage generation module may further comprise multiple stages of charge pumps, as shown in FIG. 6 which is a schematic diagram of a circuit structure in which multiple stages of charge pumps are connected in cascade provided by an embodiment of the present application. As the power supply becomes smaller and smaller, a single stage of charge pump will not be able to generate sufficient negative voltage. At this time, multiple stages of charge pumps which are stacked are required to generate sufficient negative voltage. For example, if a charge pump with a power supply of 1.8V is required to generate a negative voltage of −2.5V, at least two stages of charge pumps are needed. It should be noted that the charge pump 133 shown in FIG. 6 may be the charge pump shown in FIG. 5 or any other form of charge pump.

Figure 7A:
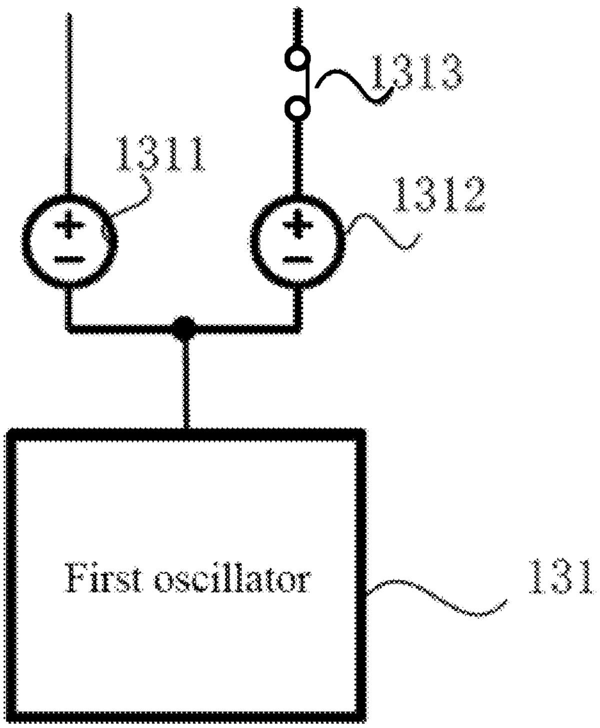
FIG. 7A is a schematic diagram of a power supply circuit of a first oscillator when a voltage switch is turned on provided by an embodiment of the present application.
Figure 7B:
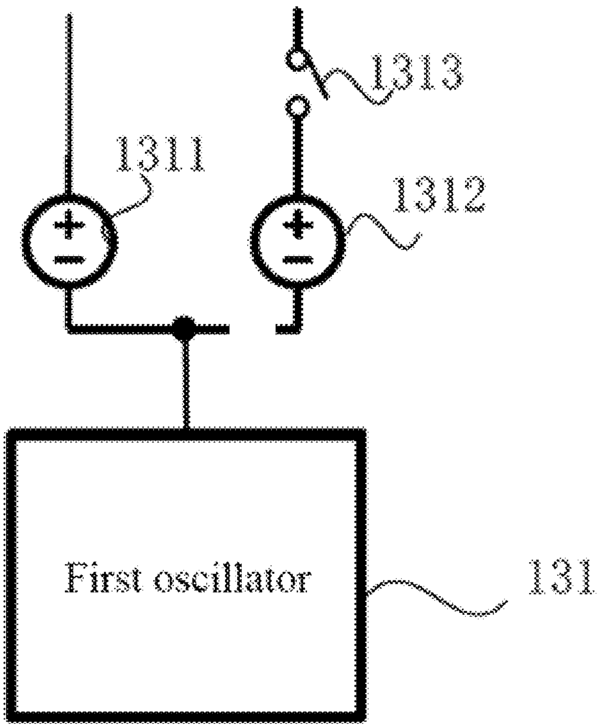
FIG. 7B is a schematic diagram of a power supply circuit of a first oscillator when the voltage switch is turned off provided by an embodiment of the present application.

Exemplarily, FIGS. 7A and 7B are schematic diagrams of a power supply circuit of a first oscillator provided by an embodiment of the present application. Referring to FIGS. 7A and 7B, the first oscillator 131 is configured to adjust an output frequency according to an operating voltage; a first end of the first oscillator 131 is connected to the first voltage source 1311 and the second voltage source 1312, wherein the second voltage source 1312 is connected in series with a voltage switch 1313, and the second voltage source 1312 is connected in series with the voltage switch 1313 to form a branch and the branch is connected in parallel with the first voltage source 1311. The voltage switch 1313 is configured to be turned on in response to the boost-mode signal and turned off in response to the normal-mode signal.

Specifically, when the voltage connected to the voltage end of the first oscillator 131 is changed, the output frequency is also changed. Referring to FIG. 7A, when the voltage switch 1313 is turned on in response to the boost-mode signal, the first voltage source 1311 and the second voltage source 1312 are both connected to the first oscillator 131, so that the first oscillator 131 outputs a high-frequency signal. Referring to FIG. 7B, when the voltage switch 1313 is turned off in response to the normal-mode signal, the first voltage source 1311 is connected to the first oscillator 131, and the second voltage source 1312 is not connected to the first oscillator 131 (that is, the voltage supply path from the second voltage source 1312 to the first oscillator 131 is electrically disconnected), so that the first oscillator 131 outputs a low-frequency signal. It should be noted that FIG. 7B is a schematic illustration for showing the disconnected state of the branch including the second voltage source 1312 when the voltage switch 1313 is turned off, rather than a separate practical circuit layout, and does not limit the physical arrangement of the circuit components.

Figure 8A:
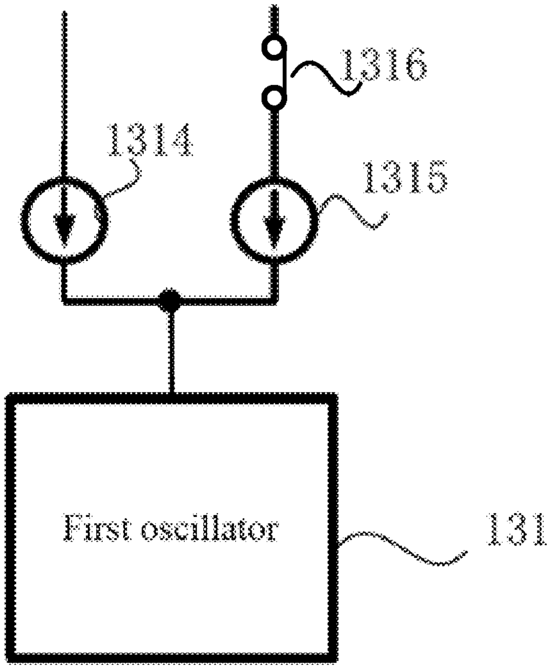
FIG. 8A is a schematic diagram of another power supply circuit of a first oscillator when a current switch is turned on provided by an embodiment of the present application.
Figure 8B:
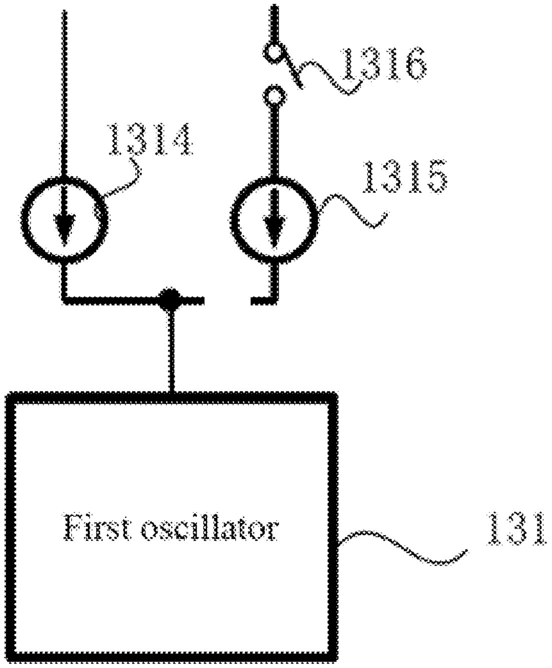
FIG. 8B is a schematic diagram of another power supply circuit of a first oscillator when the current switch is turned off provided by an embodiment of the present application.

Exemplarily, FIGS. 8A and 8B are schematic diagrams of another power supply circuit of a first oscillator provided by an embodiment of the present application. Referring to FIGS. 8A and 8B, the first oscillator 131 is configured to adjust an output frequency according to an operating voltage; a first end of the first oscillator 131 is connected to a first current source 1314 and a second current source 1315, wherein the second current source 1315 is connected in series with a current switch 1316, and a branch formed by the second current source 1315 connected in series the current switch 1316 is connected in parallel with the first current source 1314. The current switch 1316 is configured to be turned on in response to the boost-mode signal and turned off in response to the normal-mode signal.

Specifically, when the current connected to the current end of the first oscillator 131 is changed, the output frequency is also changed. Referring to FIG. 8A, when the current switch 1316 is turned on in response to the boost-mode signal, both the first current source 1314 and the second current source 1315 are connected to the first oscillator 131, so that the first oscillator 131 outputs a high-frequency signal. Referring to FIG. 8B, when the current switch 1316 is turned off in response to the normal-mode signal, the first current source 1314 is connected to the first oscillator 131, and the second current source 1315 is not connected to the first oscillator 131 (that is, the current supply path from the second current source 1315 to the first oscillator 131 is electrically disconnected), so that the first oscillator 131 outputs a low-frequency signal. It should be noted that FIG. 8B is a schematic illustration for showing the disconnected state of the branch including the second current source 1315 when the current switch 1316 is turned off, rather than a separate practical circuit layout, and does not limit the physical arrangement of the circuit components.

Figure 9:
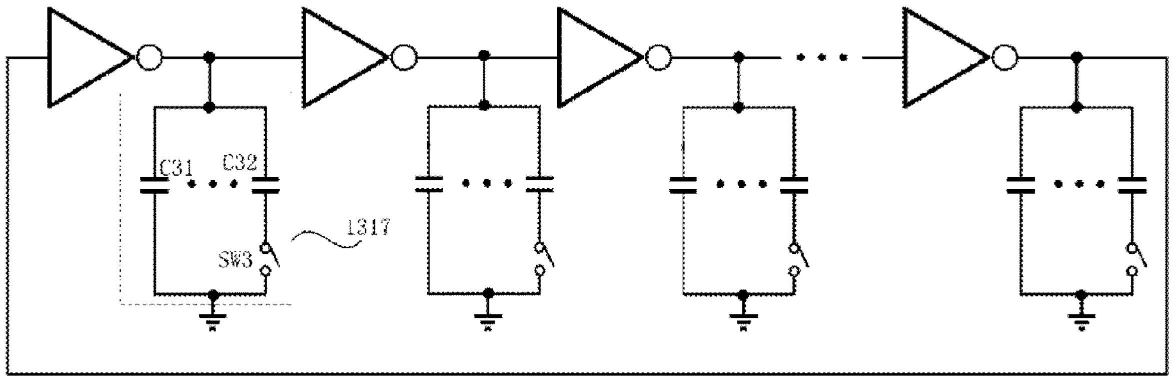
FIG. 9 is a schematic diagram of a circuit structure of a first oscillator provided by an embodiment of the present application.

Exemplarily, FIG. 9 is a schematic diagram of a circuit structure of a first oscillator provided by an embodiment of the present application. Referring to FIG. 9, the first oscillator 131 in the present embodiment is a ring oscillator. The ring oscillator comprises a delay capacitor module 1317. The delay capacitor module 1317 comprises a main delay capacitor C31 and at least one delay capacitor branch which are connected in parallel. Each delay capacitor branch comprises a secondary delay capacitor C32 and a delay capacitor switch SW3 which are connected in series. The delay capacitor switch SW3 is configured to be turned on in response to the boost-mode signal and turned off in response to the normal-mode signal.

It can be understood that the ring oscillator comprises an odd number of inverters; the frequency of the ring oscillator is mainly determined by the delay of each stage of inverter. A shorter delay time leads to a higher frequency. Therefore, the output frequency can be controlled by controlling the delay time. In the present embodiment, a delay capacitor module is added to control the delay time. For example, when the delay capacitor switch is turned on when receiving the boost-mode signal, the delay capacitor module is a high-capacity capacitor, which is beneficial to reducing the delay time, thereby increasing the output frequency. When the delay capacitor switch is turned off when receiving the normal-mode signal, the delay capacitor module is a low-capacity capacitor, thereby outputting a low frequency.

Figure 10:
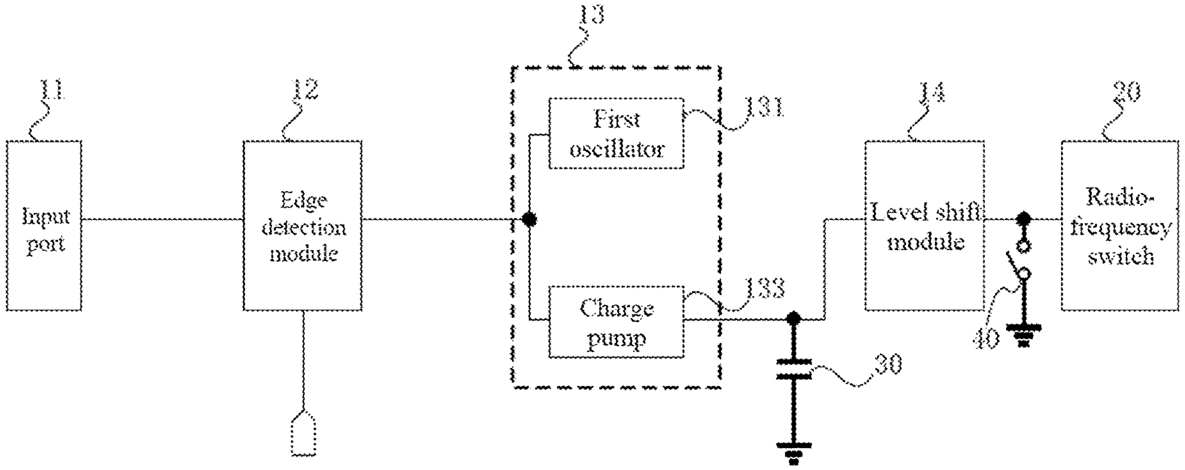
FIG. 10 is a schematic diagram of a circuit structure of a radio-frequency switch control system provided by an embodiment of the present application.

An embodiment of the present application also provides a radio-frequency switch control system, as shown in FIG. 10, which is a schematic diagram of a circuit structure of a radio-frequency switch control system provided by an embodiment of the present application. The radio-frequency switch control system comprises the radio-frequency switch control link provided by any embodiment of the present application and a radio-frequency switch 20. The radio-frequency switch control link is used to provide a bias voltage for the radio-frequency switch. Specifically, the radio-frequency switch 20 may be connected to the level shift module 14. Since the radio-frequency switch control system provided by the embodiment of the present application comprises the radio-frequency switch control link provided by any embodiment of the present application, the radio-frequency switch control system also has the same beneficial effects, which will not be described again here. As shown in FIG. 10, the radio-frequency switch control system may also comprise a control switch 40. One end of the control switch 40 is connected to a connection line between the level shift module 14 and the radio-frequency switch 20, and the other end is grounded. The control switch 40 may be used to control the radio-frequency switch 20 to be grounded or not, to implement that a gate end of the radio-frequency switch 20 is discharged to the ground in a narrow boost mode.

Figure 11:
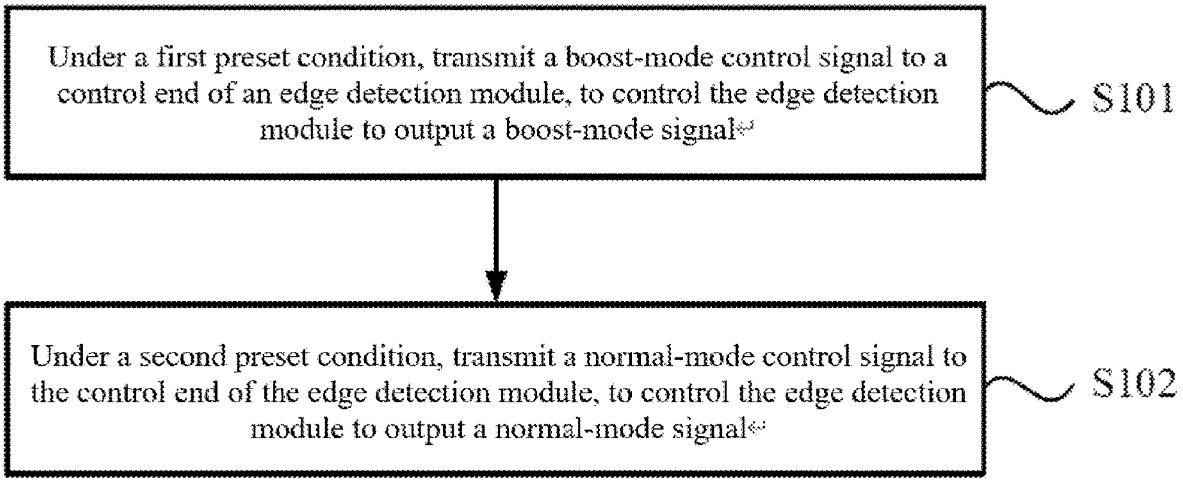
FIG. 11 is a flowchart of a control method for a radio-frequency switch control link provided in an embodiment of the present application.

An embodiment of the present application also provides a control method for a radio-frequency switch control link, as shown in FIG. 11, which is a flow chart of a control method for a radio-frequency switch control link provided by an embodiment of the present application, the control method comprising:

- step S101: under a first preset condition, transmitting a boost-mode control signal to the control end of the edge detection module, to control the edge detection module to output a boost-mode signal; and
- step S102: under a second preset condition, transmitting a normal-mode control signal to the control end of the edge detection module, to control the edge detection module to output a normal-mode signal.

Specifically, the first preset condition is, for example, a stage when the radio-frequency switch is required to generate a negative voltage or a positive voltage (that is, a stage in which a bias voltage generation module changes from an original state to a state of forming the negative voltage, or from the original state to a state of forming the positive voltage, that is, a power-on initialization process) or it is required to switch between the positive voltage and the negative voltage (that is, a switch switching process). Under the first preset condition, the edge detection module is controlled to generate a boost-mode signal, causing the bias voltage generation module to enter the boost mode. The second preset condition is, for example, a stage in which the bias voltage generation circuit can generate a stable negative or positive voltage bias. Under the second preset condition, the edge detection module is controlled to generate a normal-mode signal, causing the bias voltage generating module to enter the normal mode. In addition, it should be noted that the order of step S101 and step S102 in the present embodiment is not limited.

The control method according to the present embodiment can control the bias voltage generation module to work in the boost mode or the normal mode. In the boost mode, the first oscillator outputs a high-frequency signal, and the pump capacitor is a high-capacity capacitor, which can quickly generate the required bias voltage and also has a high driving capability; and in the normal mode, the first oscillator outputs a low-frequency signal, and the pump capacitor is a low-capacity capacitor, which can reduce spurs to ensure stable operation in the normal mode.

It should be understood that various forms of the process shown above may be used, with steps reordered, added or deleted. For example, each step described in the present application can be executed in parallel, sequentially, or in different orders, which is not limited as long as the desired results of the technical solution of the present application can be achieved.

The above-mentioned specific embodiments do not constitute a limitation on the scope of the present application. It will be understood by those skilled in the art that various modifications, combinations, sub-combinations and substitutions are possible depending on design requirements and other factors. Any modifications, equivalent substitutions and improvements made within the spirit and principles of the present application shall be included in the protection scope of the present application.

What is claimed is:

1. A radio-frequency switch control link, comprising:

an input port, configured to input an original signal;

an edge detection module, wherein an input end of the edge detection module is connected to the input port, and a control end of the edge detection module is connected to a control signal, and the edge detection module is configured to output a boost-mode signal when the control end is connected to a boost control signal and output a normal-mode signal when the control end is connected to a normal control signal; and a bias voltage generation module, comprising a first oscillator and at least one stage of a charge pump, wherein the charge pump and the first oscillator are both connected to an output end of the edge detection module; the first oscillator is configured to output a first frequency in response to the boost-mode signal, and output a second frequency in response to the normal-mode signal, wherein the first frequency is greater than the second frequency; the charge pump comprises a pump capacitor unit, and the pump capacitor unit is configured to have a first capacitance value in response to the boost-mode signal, and have a second capacitance value in response to the normal-mode signal, wherein the first capacitance value is greater than the second capacitance value.

2. The radio-frequency switch control link according to claim 1, wherein the bias voltage generation module further comprises a low dropout linear regulator configured to supply power to the charge pump and the first oscillator; and the low dropout linear regulator is connected to the output end of the edge detection module, and the low dropout linear regulator is configured to output a first voltage in response to the boost-mode signal and output a second voltage in response to the normal-mode signal, wherein the first voltage is greater than the second voltage.

3. The radio-frequency switch control link according to claim 1, wherein the edge detection module comprises: a first two-way selector, a second two-way selector, a first inverter, a first D flip-flop, a second D flip-flop, an OR gate and a second oscillator;

a first input end of the first two-way selector and an input end of the first inverter are connected to each other to serve as the input end of the edge detection module; a second input end of the first two-way selector is connected to a logic high level; a control end of the first two-way selector and a control end of the second two-way selector are connected to each other to serve as the control end of the edge detection module; an output end of the first two-way selector is connected to a clock end of the first D flip-flop;

a first input end of the second two-way selector is connected to an output end of the first inverter, a second input end of the second two-way selector is connected to the logic high level, and an output end of the two-way selector is connected to a clock end of the second D flip-flop;

a D end of the first D flip-flop and a D end of the second D flip-flop are both connected to an output end of the second oscillator; a Q end of the first D flip-flop and a Q end of the second D flip-flop are connected to two input ends of the OR gate respectively; and an output end of the OR gate serves as the output end of the edge detection module.

4. The radio-frequency switch control link according to claim 1, wherein the pump capacitor unit comprises a main capacitor and at least one branch connected in parallel with the main capacitor, and each branch comprises a capacitor switch and a branch capacitor connected in series; the capacitor switch is configured to be turned on in response to the boost-mode signal and turned off in response to the normal-mode signal.

5. The radio-frequency switch control link according to claim 1, wherein the first oscillator is configured to adjust an output frequency according to an operating voltage; a voltage end of the first oscillator is connected to a first voltage source and a second voltage source; wherein the second voltage source is connected in series with a voltage switch, a branch formed by the second voltage source connected in series with the voltage switch is connected in parallel with the first voltage source, and the voltage switch is configured to be turned on in response to the boost-mode signal and turned off in response to the normal-mode signal.

6. The radio-frequency switch control link according to claim 1, wherein the first oscillator is configured to adjust an output frequency according to an operating current; a current end of the first oscillator is connected to a first current source and a second current source; wherein the second current source is connected in series with a current switch, a branch formed by the second current source connected in series with the current switch is connected in parallel with the first current source, and the current switch is configured to be turned on in response to the boost-mode signal and turned off in response to the normal-mode signal.

7. The radio-frequency switch control link according to claim 1, wherein the first oscillator is a ring oscillator; the ring oscillator comprises a delay capacitor module, and the delay capacitor module comprises a main delay capacitor and at least one delay capacitor branch which are connected in parallel; each delay capacitor branch comprises a secondary delay capacitor and a delay capacitor switch which are connected in series, and the delay capacitor switch is configured to be turned on in response to the boost-mode signal and turned off in response to the normal-mode signal.

8. The radio-frequency switch control link according to claim 1, further comprising a level shift module, wherein the level shift module is connected to an output end of the bias voltage generation module.

9. A radio-frequency switch control system, comprising a radio-frequency switch control link and a radio-frequency switch, wherein the radio-frequency switch control link comprises:

an input port, configured to input an original signal;

an edge detection module, wherein an input end of the edge detection module is connected to the input port, and a control end of the edge detection module is connected to a control signal, and the edge detection module is configured to output a boost-mode signal when the control end is connected to a boost control signal and output a normal-mode signal when the control end is connected to a normal control signal; and a bias voltage generation module, comprising a first oscillator and at least one stage of a charge pump, wherein the charge pump and the first oscillator are both connected to an output end of the edge detection module; the first oscillator is configured to output a first frequency in response to the boost-mode signal, and output a second frequency in response to the normal-mode signal, wherein the first frequency is greater than the second frequency; the charge pump comprises a pump capacitor unit, and the pump capacitor unit is configured to have a first capacitance value in response to the boost-mode signal, and have a second capacitance value in response to the normal-mode signal, wherein the first capacitance value is greater than the second capacitance value.

10. The radio-frequency switch control system according to claim 9, wherein the bias voltage generation module further comprises a low dropout linear regulator configured to supply power to the charge pump and the first oscillator; and the low dropout linear regulator is connected to the output end of the edge detection module, and the low dropout linear regulator is configured to output a first voltage in response to the boost-mode signal and output a second voltage in response to the normal-mode signal, wherein the first voltage is greater than the second voltage.

11. The radio-frequency switch control system according to claim 9, wherein the edge detection module comprises: a first two-way selector, a second two-way selector, a first inverter, a first D flip-flop, a second D flip-flop, an OR gate and a second oscillator;

a first input end of the first two-way selector and an input end of the first inverter are connected to each other to serve as the input end of the edge detection module; a second input end of the first two-way selector is connected to a logic high level; a control end of the first two-way selector and a control end of the second two-way selector are connected to each other to serve as the control end of the edge detection module; an output end of the first two-way selector is connected to a clock end of the first D flip-flop;

a first input end of the second two-way selector is connected to an output end of the first inverter, a second input end of the second two-way selector is connected to the logic high level, and an output end of the two-way selector is connected to a clock end of the second D flip-flop;

a D end of the first D flip-flop and a D end of the second D flip-flop are both connected to an output end of the second oscillator; a Q end of the first D flip-flop and a Q end of the second D flip-flop are connected to two input ends of the OR gate respectively; and an output end of the OR gate serves as the output end of the edge detection module.

12. The radio-frequency switch control system according to claim 9, wherein the pump capacitor unit comprises a main capacitor and at least one branch connected in parallel with the main capacitor, and each branch comprises a capacitor switch and a branch capacitor connected in series; the capacitor switch is configured to be turned on in response to the boost-mode signal and turned off in response to the normal-mode signal.

13. The radio-frequency switch control system according to claim 9, wherein the first oscillator is configured to adjust an output frequency according to an operating voltage; a voltage end of the first oscillator is connected to a first voltage source and a second voltage source; wherein the second voltage source is connected in series with a voltage switch, a branch formed by the second voltage source connected in series with the voltage switch is connected in parallel with the first voltage source, and the voltage switch is configured to be turned on in response to the boost-mode signal and turned off in response to the normal-mode signal.

14. The radio-frequency switch control system according to claim 9, wherein the first oscillator is configured to adjust an output frequency according to an operating current; a current end of the first oscillator is connected to a first current source and a second current source; wherein the second current source is connected in series with a current switch, a branch formed by the second current source connected in series with the current switch is connected in parallel with the first current source, and the current switch is configured to be turned on in response to the boost-mode signal and turned off in response to the normal-mode signal.

15. The radio-frequency switch control system according to claim 9, wherein the first oscillator is a ring oscillator; the ring oscillator comprises a delay capacitor module, and the delay capacitor module comprises a main delay capacitor and at least one delay capacitor branch which are connected in parallel; each delay capacitor branch comprises a secondary delay capacitor and a delay capacitor switch which are connected in series, and the delay capacitor switch is configured to be turned on in response to the boost-mode signal and turned off in response to the normal-mode signal.

16. The radio-frequency switch control system according to claim 9, wherein the radio-frequency switch control link further comprises a level shift module, and the level shift module is connected to an output end of the bias voltage generation module.

17. A control method for the radio-frequency switch control link according to claim 1, comprising:

under a first preset condition, transmitting a boost-mode control signal to the control end of the edge detection module, to control the edge detection module to output the boost-mode signal; and under a second preset condition, transmitting a normal-mode control signal to the control end of the edge detection module, to control the edge detection module to output the normal-mode signal.

* * * * *